US008681911B2

(12) United States Patent
Lee et al.

(10) Patent No.: US 8,681,911 B2
(45) Date of Patent: Mar. 25, 2014

(54) IDENTIFICATION SIGNAL ANALYZING APPARATUS AND METHOD FOR COMPENSATING FOR SEPARATION AND ATTENUATION OF CHANNEL PROFILE

(75) Inventors: Jae-Young Lee, Seoul (KR); Sung-Ik Park, Daejon (KR); Ho-Min Eum, Daejon (KR); Jae-Hyun Seo, Daejon (KR); Heung-Mook Kim, Daejon (KR); Jong-Soo Lim, Daejon (KR); Soo-In Lee, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 734 days.

(21) Appl. No.: 12/676,656

(22) PCT Filed: May 15, 2008

(86) PCT No.: PCT/KR2008/002707

§ 371 (c)(1),
(2), (4) Date: Jan. 21, 2011

(87) PCT Pub. No.: WO2009/031748

PCT Pub. Date: Mar. 12, 2009

(65) Prior Publication Data

US 2011/0111722 A1 May 12, 2011

(30) Foreign Application Priority Data

Sep. 6, 2007 (KR) ........................ 10-2007-0090534

(51) Int. Cl.
*H03D 1/00* (2006.01)

(52) U.S. Cl.
USPC .............. 375/343; 375/142; 375/150; 367/40

(58) Field of Classification Search
None
See application file for complete search history.

(56) References Cited

U.S. PATENT DOCUMENTS

| | | | | |
|---|---|---|---|---|
| 5,940,429 | A | 8/1999 | Lam et al. | |
| 2002/0145680 | A1* | 10/2002 | Hong | 348/725 |
| 2004/0252244 | A1 | 12/2004 | Bae et al. | |
| 2005/0117070 | A1* | 6/2005 | Wu et al. | 348/725 |
| 2008/0019430 | A1* | 1/2008 | Suzuki et al. | 375/150 |

FOREIGN PATENT DOCUMENTS

| | | |
|---|---|---|
| KR | 10-2006-0069183 | 6/2006 |

OTHER PUBLICATIONS

International Search Report for PCT/KR2008/002707, mailed Aug. 13, 2008.

* cited by examiner

*Primary Examiner* — Adolf Dsouza
(74) *Attorney, Agent, or Firm* — Staas & Halsey LLP

(57) ABSTRACT

Provided is an identification signal analyzing apparatus and method for compensating power of a channel profile occurring at a conventional identification signal analyzing apparatus by using a power compensation. The identification signal analyzing apparatus includes: an identification signal generator for generating an identification signal identical to a known identification signal inserted by a transmission device; a partial correlator for calculating a correlation value between a received signal including the known identification signal inserted by the transmission device and the identification signal generated by the identification signal generator through a partial correlation; a power compensator for compensating power of the correlation value calculated by the partial correlator; and a channel profile extractor for extracting a channel profile from the correlation value compensated by the power compensator.

8 Claims, 10 Drawing Sheets

IDENTIFICATION SIGNAL ANALYZING APPARATUS AND METHOD FOR COMPENSATING FOR SEPARATION AND ATTENUATION OF CHANNEL PROFILE

CROSS REFERENCE TO RELATED APPLICATIONS

This application claims the benefit under 35 U.S.C. Section 371, of PCT International Application No. PCT/KR2008/002707, filed May 15, 2008, which claimed priority to Korean Application No. 10-2007-0090534, filed Sep. 6, 2007, the disclosures of which are hereby incorporated by reference.

TECHNICAL FIELD

The present invention relates to an identification signal analyzing apparatus and method for compensating power of a channel profile; and, more particularly, to an identification signal analyzing apparatus and method for compensating power of a channel profile occurring at a conventional identification signal analyzing apparatus by using a power compensation.

This work was supported by the IT R&D program of MIC/IITA [2006-S-016-02, "Development of Distributed Translator Technology for Terrestrial DTV"].

BACKGROUND ART

In general, a main transmitter and a repeater are installed according to an environmental geography and topography and a service coverage area. The repeater is installed in an area where a signal from a main transmitter is received at a weak level, and it can solve an unstable reception and expand a coverage area of the main transmitter.

FIG. 1 is a view for explaining an example of a service through conventional repeaters using different frequencies.

Referring to FIG. 1, in the service using the conventional repeaters, a main transmitter 101 transmits a signal at a transmission frequency A, and repeaters 102 to 105 respectively re-transmit the signal at frequencies B, C, D and E that are different from the transmission frequency A. The repeaters 102 to 105 of FIG. 1 use different frequencies B, C, D and E to prevent unstable reception of the signal from the main transmitter 101 and expand the service coverage area. Since the repeaters 102 to 105 use multiple frequency bands, a large amount of frequency resources are consumed, thus degrading frequency use efficiency.

If multiple repeaters provide a broadcasting service using the same frequency as that of the main transmitter, the frequency can be reused even over a short distance, thus improving the frequency use efficiency.

FIG. 2 is a view for explaining another example of a service using conventional repeaters. In FIG. 2, the repeaters are on-channel repeaters using the same frequency.

That is, a main transmitter 201 transmits a signal at a transmission frequency A, and on-channel repeaters 202 to 205 re-transmit the signal at the same frequency as the transmission frequency A. However, since a high isolation of Tx/Rx antenna is required, the service using the on-channel repeaters has limitations of low utilization of existing transmission facilities and high investment costs.

A distributed transmission network may be implemented using distributed translators (DTxR). This distributed transmission method has advantages of maximized use of the existing transmission facilities, short implementation time, cost efficiency, and improved frequency use efficiency.

FIG. 3 is a view for explaining an example of a service using distributed translators. A main transmitter 301 transmits a broadcasting signal at a transmission frequency A, and distributed translators 302 to 305 re-transmit the signal at a frequency B different from the transmission frequency A.

If a network is configured using a technology associated with the on-channel repeaters or distributed translators, the frequency is reused, thereby improving the frequency use efficiency. However, interference with adjacent repeaters occurs because a single frequency is used among multiple transmitters or repeaters. To mitigate the interference among multiple transmitters or repeaters, an identification signal having an excellent correlation characteristic is assigned to each transmitter and repeater and is inserted in a signal to be transmitted. By using a signal analyzer, a desired identification signal can be detected in order to display channel profiles including interferences from other signals.

A number of sequences used as the identification signal are embedded in a spread spectrum form in order to minimize an influence of a conventional DTV service. For this reason, a high bit resolution is required for signal representation. Also, a long sequence is used as an identification signal to acquire an excellent correlation characteristic. For example, in the Advanced Television Systems Committee digital TV (ATSC DTV) system, a Kasami sequence having a specific length is used, and inserted with signal power smaller than signal power of the DTV signal by from 21 dB to 39 dB. Thus, a large computation amount, i.e., high complexity is undesirably needed for implementation of a signal analyzer, i.e., an identification signal analyzing apparatus that detects and analyzes such an identification signal.

Therefore, there has been proposed a technology associated with identification signal analysis using a partial correlation having low complexity to analyze identification signals having a high bit resolution and a long length.

However, the technology associated with the identification signal analysis has limitations in which the power of detected identification signal can be attenuated and separated, which results in attenuation and separation of a channel profile.

DISCLOSURE

Technical Problem

An embodiment of the present invention is directed to providing an identification signal analyzing apparatus and method for compensating power of a channel profile, which occurs at a conventional identification signal analyzing apparatus, by using power compensation.

Other objects and advantages of the present invention can be understood by the following description, and become apparent with reference to the embodiments of the present invention. Also, it is obvious to those skilled in the art of the present invention that the objects and advantages of the present invention can be realized by the means as claimed and combinations thereof.

Technical Solution

In accordance with an aspect of the present invention, there is provided an identification signal analyzing apparatus, which includes: an identification signal generator for generating an identification signal identical to a known identification signal inserted by a transmission device; a partial correlator for calculating a correlation value between a received signal including the known identification signal inserted by the transmission device and the identification signal generated by the identification signal generator through a partial correlation; a power compensator for compensating power of the correlation value calculated by the partial correlator; and a channel profile extractor for extracting a channel profile from the correlation value compensated by the power compensator.

In accordance with another aspect of the present invention, there is provided an identification signal analyzing method, which includes: generating an identification signal identical to a known identification signal; calculating a correlation value between a received signal including the known identification signal and the generated identification signal through a partial correlation; compensating power of the calculated correlation value; and extracting a channel profile from the compensated correlation value.

Advantageous Effects

According to the present invention, power compensation of a channel profile, which occurs at a conventional identification signal analyzing apparatus, is made by using a power compensation, so that an identification signal can be accurately analyzed.

A transmitted radio frequency (RF) signal including known identification signals inserted by transmission devices, e.g., multiple transmitters or repeaters, is converted into a signal of a desired band, and an identification signal identical to the inserted identification signal is generated. Thereafter, a correlation value between the converted signal and the generated identification signal is calculated through a partial correlation, and a 90° inverted value of the calculated correlation value is extracted. The calculated correlation value is compensated using the extracted 90° inverted value. Based on the correlation value compensated through the power compensation, a channel profile of a multi-path signal with compensated power can be extracted.

BEST MODE FOR THE INVENTION

The advantages, features and aspects of the invention will become apparent from the following description of the embodiments with reference to the accompanying drawings, which is set forth hereinafter. Rather, these embodiments are provided so that this disclosure will be thorough and complete, and will fully convey the scope of the present invention to those skilled in the art. Therefore, in some embodiments, well-known processes, device structures, and technologies will not be described in detail to avoid ambiguousness of the present invention. Preferred embodiments of the present invention will be described below in more detail with reference to the accompanying drawings.

Figure 1:
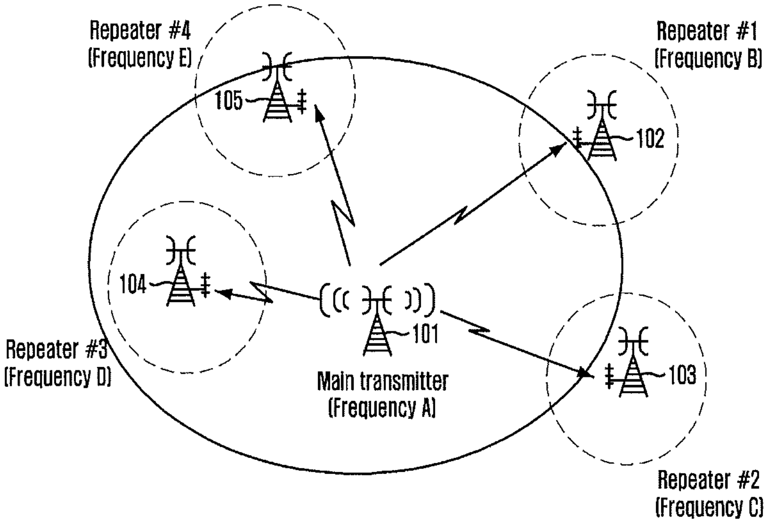
FIG. 1 (PRIOR ART)
FIG. 1 is a view for explaining an example of a service using a conventional repeater.
Figure 2:
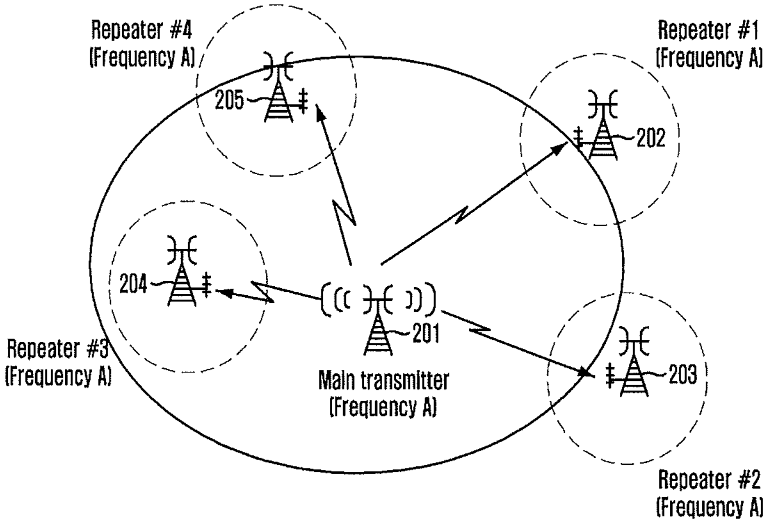
FIG. 2 (PRIOR ART)
FIG. 2 is a view for explaining another example of a service using a conventional repeater.
Figure 3:
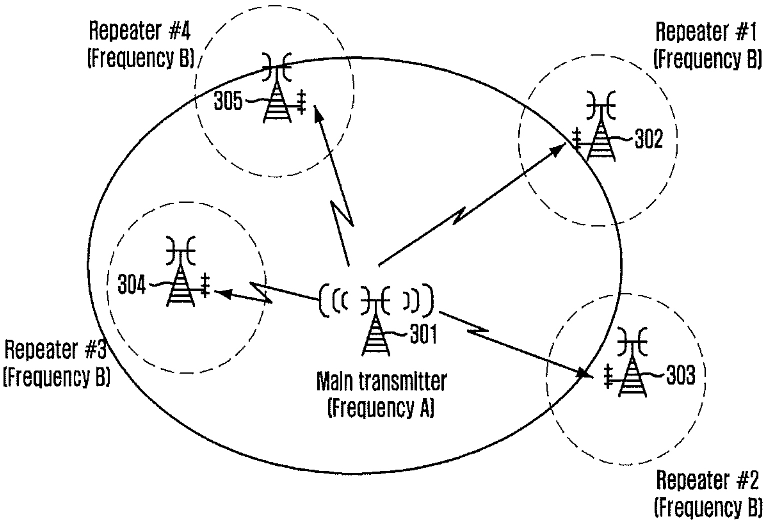
FIG. 3 (PRIOR ART)
FIG. 3 is a view for explaining an example of a service using a conventional distributed repeater.
Figure 4:
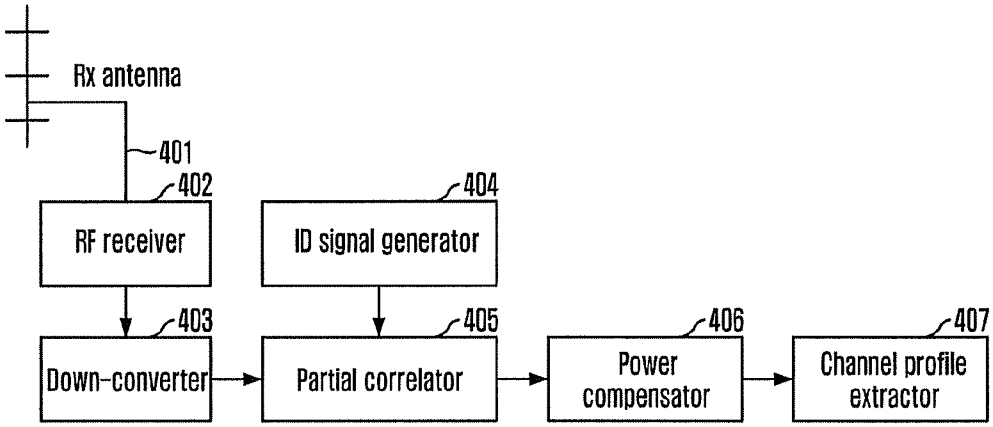
FIG. 4 is a block diagram of an identification signal analyzing apparatus for compensating power of a channel profile in accordance with an embodiment of the present invention.

FIG. 4 is a block diagram of an identification signal analyzing apparatus in accordance with an embodiment of the present invention.

Referring to FIG. 4, the identification signal analyzing apparatus in accordance with an embodiment of the present invention includes a radio frequency (RF) receiver 402, a down-converter 403, an identification signal generator 404, a partial correlator 405, a power compensator 406, and a channel profile extractor 407. The RF receiver 402 receives a transmitted RF signal via an Rx antenna. The RF signal includes known identification signals inserted in the RF signal by transmission devices such as multiple transmitters or repeaters. The down-converter 403 down-converts the RF signal received through the RF receiver 402 into a signal of a desired band. The identification signal generator 404 generates an identification signal that is identical to the identification signal inserted by the transmission device, e.g., a transmitter or repeaters. The partial correlator 405 calculates a correlation value between the signal down-converted by the down-converter 403 and the identification signal generated by the identification signal generator 404 through a partial correlation. The power compensator 406 extracts a 90° inverted value from the correlation value calculated by the partial correlator 405 and compensates power of the correlation value for separation and attenuation of the correlation value by using the extracted 90° inverted value. The channel profile extractor 407 extracts a channel profile of a multi-path signal, which is caused by a channel between the transmission device, e.g., a transmitter or repeaters, and a signal analyzer, i.e., the identification signal analyzing apparatus, based on the correlation value compensated by the power compensator 406.

Operations of the identification signal analyzing apparatus using a power compensator in accordance with the current embodiment of the present invention will now be described.

The Rx antenna 401 and the RF receiver 402 receive an RF signal including known identification signals inserted in the RF signal by transmission devices such as multiple transmitters or repeaters. The down-converter 403 down-converts the received RF signal into a signal of a desired band. The identification signal generator 404 generates an identification signal identical to the inserted identification signal. The partial correlator 405 calculates a correlation value between the down-converted signal and the generated identification signal through a partial correlation. Then, power compensator 406 extracts a 90° inverted value from the calculated correlation value, and compensates power of the correlation value for separation and attenuation thereof by using the extracted 90° inverted value. Thereafter, the channel profile extractor 406 extracts a channel profile of a multi-path signal from the compensated correlation value. Those processes will now be described in more detail with reference to FIG. 5.

Figure 5:
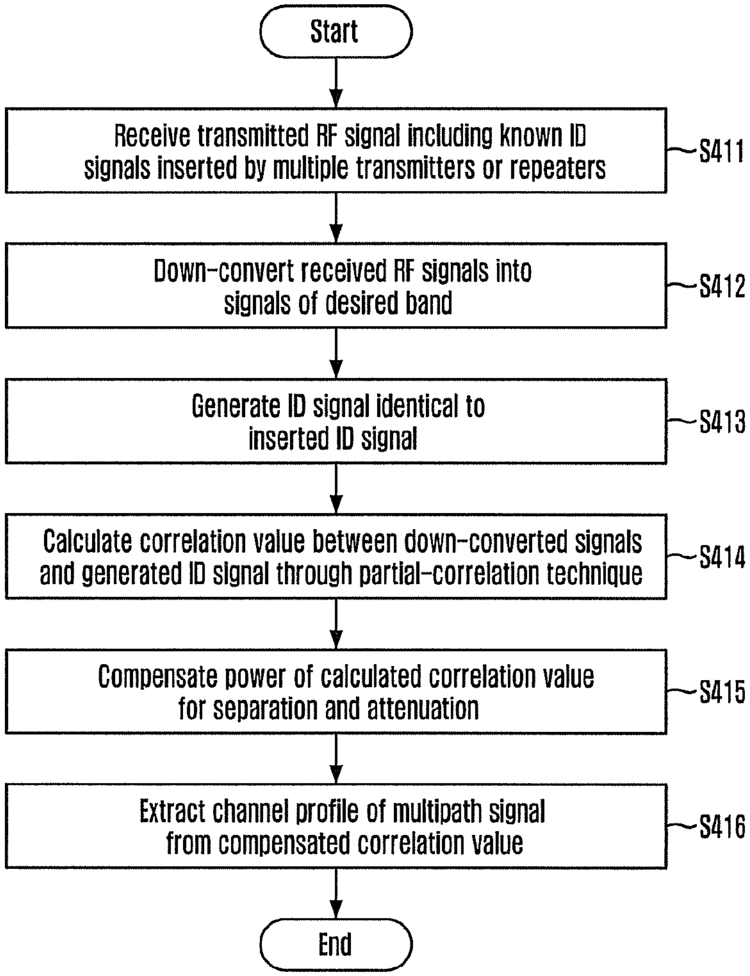
FIG. 5 is a flowchart of an identification signal analyzing method for compensating power of a channel profile in accordance with an embodiment of the present invention

FIG. 5 is a flowchart of an identification signal analyzing method for compensating power of a channel profile in accordance with an embodiment of the present invention.

In operation S411, an RF signal is received. The RF signal includes known identification signals inserted in the RF signal by the transmission devices such as multiple transmitters or repeaters.

In operation S412, the received RF signal is down-converted into a signal of a desired band.

In operation S413, an identification signal that is identical to the identification signal inserted by the transmission device is generated.

In operation S414, a correlation value between the down-converted signal and the generated identification signal is calculated through a partial correlation.

In operation S415, a 90° inverted value is extracted from the calculated correlation value, and power of the correlation value is compensated for its separation and attenuation by using the extracted 90° inverted value.

In operation S416, a channel profile of a multi-path signal is extracted from the compensated correlation value.

Figure 6:
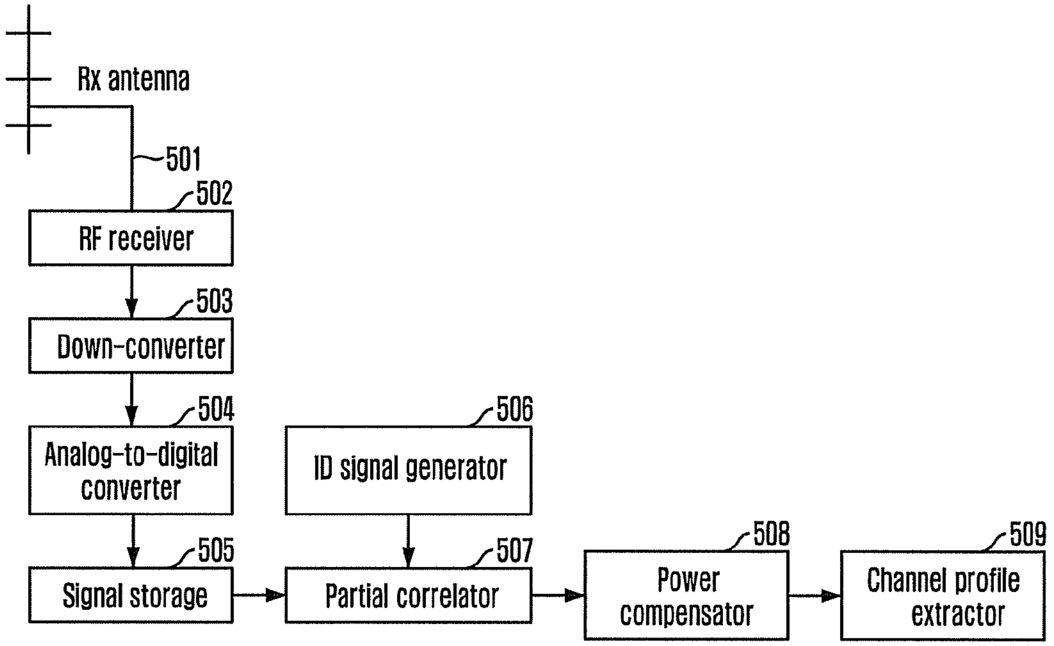
FIG. 6 is a block diagram of an identification signal analyzing apparatus for compensating power of a channel profile in accordance with another embodiment of the present invention.

FIG. 6 is a block diagram of an identification signal analyzing apparatus for compensating power of a channel profile in accordance with another embodiment of the present invention.

Referring to FIG. 6, the identification signal analyzing apparatus for compensating power of a channel profile in accordance with another embodiment of the present invention includes an RF receiver 502, a down-converter 503, an analog-to-digital converter (ADC) 504, a signal storage 505, an identification signal generator 506, a partial correlator 507, a power compensator 508, and a channel profile extractor 509.

The RF receiver 502 receives an RF signal via an Rx antenna 501. The RF signal includes known identification signals inserted therein by transmission devices such as multiple transmitters or repeaters. The down-converter 503 down-converts the RF signal received by the RF receiver 502 into a signal of a desired band. The ADC 504 converts the down-converted analog signal into a digital signal. The signal storage 505 stores the converted digital signal.

The identification signal generator 506 generates an identification signal identical to the identification signal inserted by the transmission devices. The partial correlator 507 calculates a correlation value between the digital signal stored in the signal storage 505 and the identification signal generated by the identification signal generator 506 through a partial correlation.

The power compensator 508 extracts a 90° inverted value from the correlation value calculated by the partial correlator 507 and compensates power of the calculated correlation value for separation and attenuation of the correlation value by using the extracted 90° inverted value. The channel profile extractor 509 extracts a channel profile of a multi-path signal, which is caused by a channel between the transmission device, e.g., a transmitter or repeaters and a signal analyzer, i.e., the identification signal analyzing apparatus, from the correlation value compensated by the power compensator 508.

Operations of the identification signal analyzing apparatus for compensating power of a channel profile in accordance with another embodiment of the present invention will now be described in more detail with reference to FIG. 7.

Figure 7:
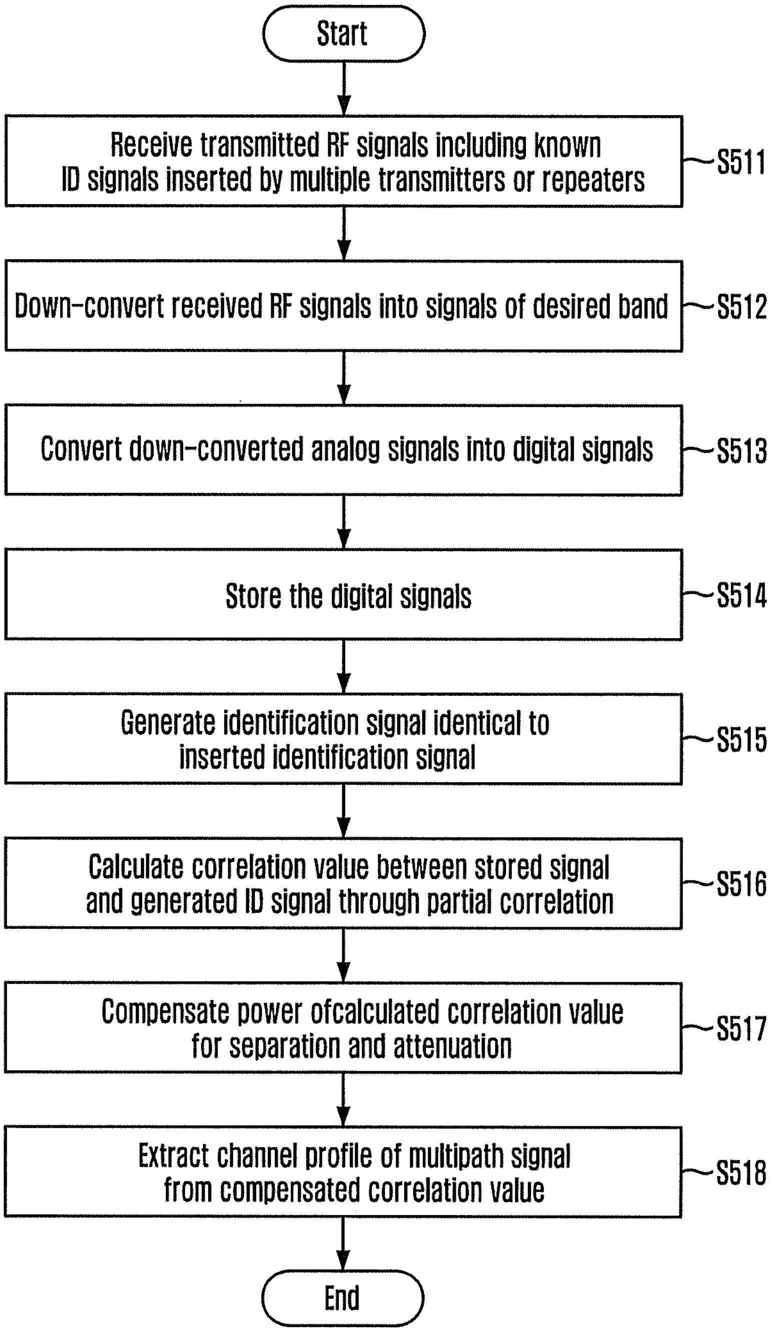
FIG. 7 is a flowchart of an identification signal analyzing method for compensating power of a channel profile in accordance with another embodiment of the present invention.

FIG. 7 is a flowchart of an identification signal analyzing method for compensating power of a channel profile in accordance with another embodiment of the present invention.

In operation S511, an RF signal is received. The RF signal includes known identification signals inserted therein by transmission devices such as multiple transmitters or repeaters.

In operation S512, the received RF signal is down-converted into a signal of a desired band.

In operation S513, the down-converted analog signal is converted into a digital signal.

In operation S514, the converted digital signal is stored.

In operation S515, an identification signal identical to the identification signal inserted by the transmission device is generated.

In operation S516, a correlation value between the stored digital signal and the generated identification signal is calculated through a partial correlation.

In operation S517, a 90° inverted value is extracted from the calculated correlation value, and power of the calculated correlation value is compensated for its separation and attenuation of the correlation value by using the extracted 90° inverted value.

In operation S518, a channel profile of a multi-path signal is extracted from the compensated correlation value.

Figure 8:
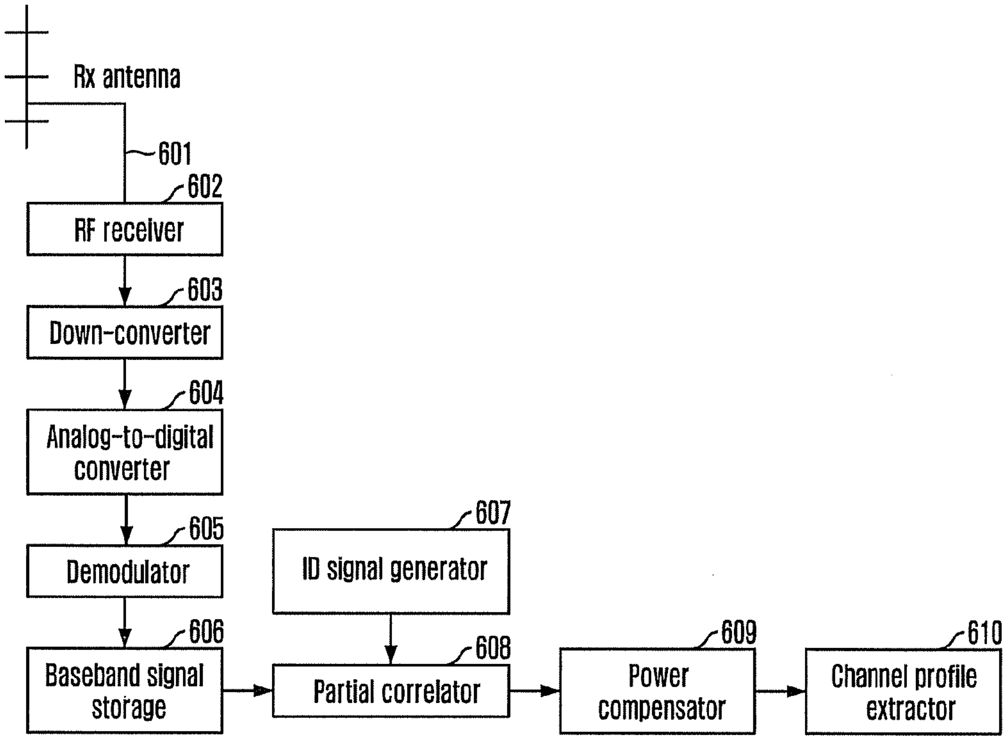
FIG. 8 is a block diagram of an identification signal analyzing apparatus for compensating power of a channel profile in accordance with another embodiment of the present invention.

FIG. 8 is a block diagram of an identification signal analyzing apparatus for compensating power of a channel profile in accordance with another embodiment of the present invention.

Referring to FIG. 8, the identification signal analyzing apparatus for compensating power of a channel profile in accordance with another embodiment of the present invention includes an RF receiver 602, a down-converter 603, an ADC 604, a demodulator 605, a baseband signal storage 606, an identification signal generator 607, a partial correlator 608, a power compensator 609, and a channel profile extractor 610.

The RF receiver 602 receives an RF signal via an Rx antenna 601. The RF signal includes known identification signals inserted therein by transmission devices such as multiple transmitters or repeaters. The down-converter 603 down-converts the RF signal received by the RF receiver 602 into a signal of a desired band. The ADC 604 converts the down-converted analog signal into a digital signal.

The demodulator 605 demodulates the digital signal converted by the ADC 604 to a baseband signal. The baseband signal storage 606 stores the baseband signal demodulated by the demodulator 605. The identification signal generator 607 generates an identification signal identical to the identification signal inserted by the transmission device.

The partial correlator 608 calculates a correlation value between the baseband signal stored in the baseband signal storage 606 and the identification signal generated by the identification signal generator 607 through a partial correlation. The power compensator 609 extracts a 90° inverted value from the correlation value calculated by the partial correlator 608 and compensates power of the calculated correlation value by using the extracted 90° inverted value.

The channel profile extractor 610 extracts a channel profile of a multi-path signal, which is caused by a channel between the transmission device, e.g., a transmitter or repeaters and a signal analyzer, i.e., the identification signal analyzing apparatus, from the correlation value compensated by the power compensator 609.

Operations of the identification signal analyzing apparatus for compensating power of a channel profile in accordance with another embodiment of the present invention will now be described in more detail with reference to FIG. 9.

Figure 9:
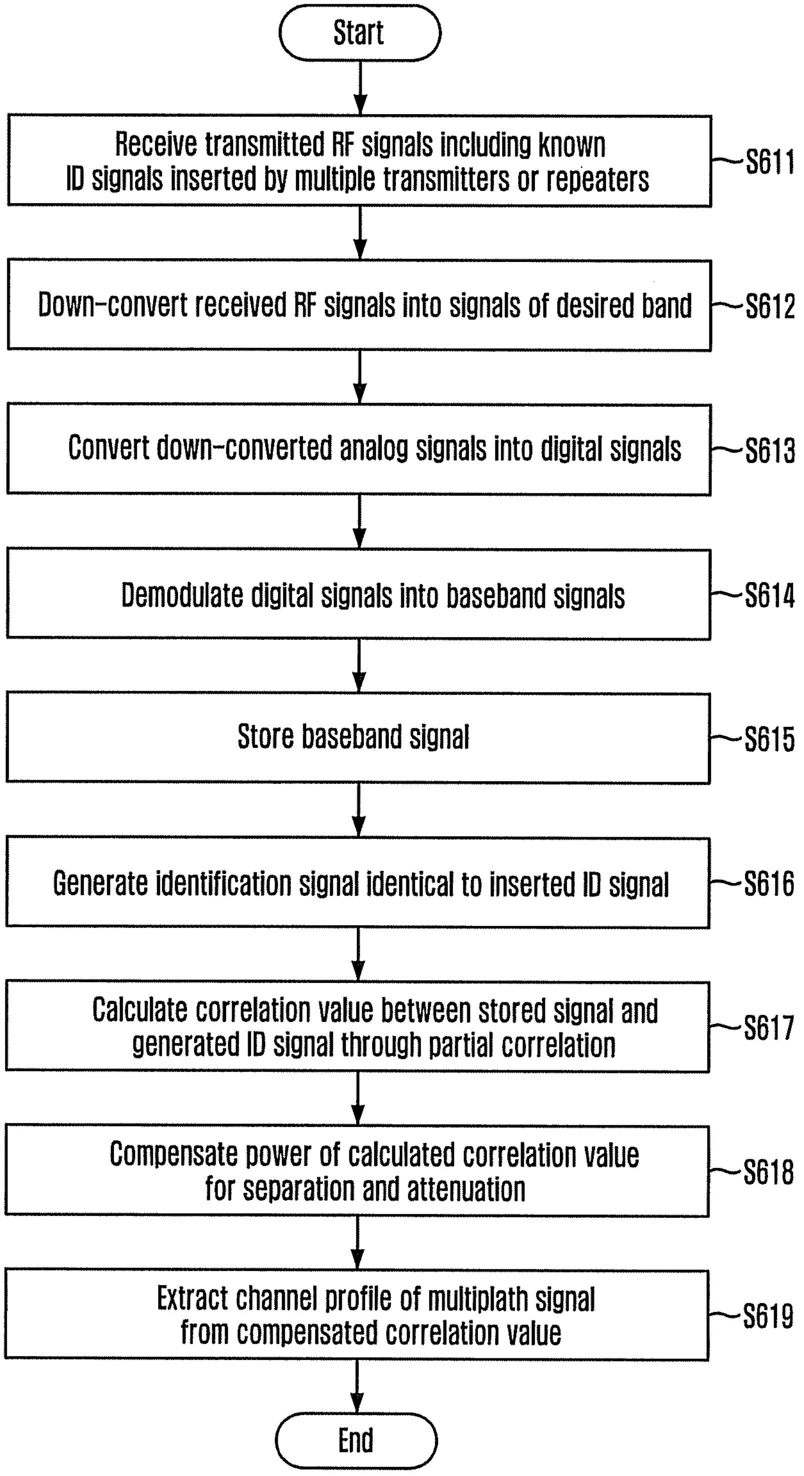
FIG. 9 is a flowchart of an identification signal analyzing method for compensating power of a channel profile in accordance with another embodiment of the present invention.

FIG. 9 is a flowchart of an identification signal analyzing method for compensating power of a channel profile in accordance with another embodiment of the present invention.

In operation S611, an RF signal is received. The RF signal includes known identification signals inserted therein by transmission devices such as multiple transmitters or repeaters.

In operation S612, the received RF signal is down-converted into a signal of a desired band.

In operation S613, the down-converted analog signal is converted into a digital signal.

In operation S614, the digital signal is demodulated to a baseband signal.

In operation S615, the demodulated baseband signal is stored.

In operation S616, an identification signal identical to the identification signal inserted by the transmission device is generated.

In operation S617, a correlation value between the stored demodulated signal and the generated identification signal is calculated through a partial correlation.

In operation S618, a 90° inverted value is extracted from the calculated correlation value, and power of the calculated correlation value is compensated for its separation and attenuation by using the extracted 90° inverted value.

In operation S619, a channel profile of a multi-path signal is extracted from the compensated correlation value.

The demodulator 605, the baseband signal storage 606, the identification signal generators 405, 506 and 607, the partial correlator 405, 507 and 608 and the power compensators 406, 508 and 609 may be variously implemented according to the system standard. Embodiments of those elements in the ATSC DTV standard will now be described with reference to accompanying drawings.

Figure 10:
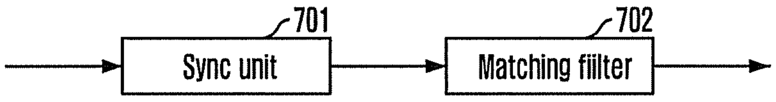
FIG. 10 is a block diagram of a modulator in the ATSC DTV standard in accordance with an embodiment of the present invention.

FIG. 10 is a block diagram of a demodulator in the ATSC DTV standard in accordance with an embodiment of the present invention.

Referring to FIG. 10, the demodulator 605 in the ATSC DTV standard includes a synchronization (Sync) unit 701 and a matching filter 702.

The sync unit 701 removes a frequency and a timing offset from a digital signal converted by the ADC 604, and the matching filter 702 causes the signal from which the frequency and timing offset have been removed by the sync unit 701 to become a baseband signal having a maximized signal-to-noise ratio (SNR).

Figure 11:
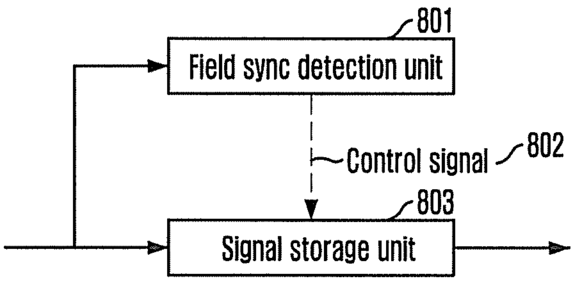
FIG. 11 is a block diagram of a baseband signal storage in the ATSC DTV standard in accordance with an embodiment of the present invention.

FIG. 11 is a block diagram of a baseband signal storage in the ATSC DTV standard in accordance with an embodiment of the present invention.

Referring to FIG. 11, the baseband signal storage 606 in the ATSC DTV standard includes a field sync detection unit 801 and a signal storage unit 803.

The field sync detection unit 801 detects a field sync signal from a baseband signal generated by the matching filter 702 of the demodulator 605, and transmits a control signal to the signal storage unit 803 according to whether the field sync signal is detected. The signal storage unit 803 stores only a data signal if a control signal 802 from the field sync detection unit 801 indicates that the field sync signal is detected. If the control signal indicates that the field sync signal is not detected, the signal storage unit 803 stores both a data signal and a field sync signal.

Figure 12:
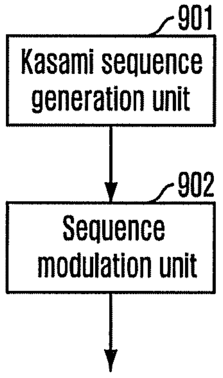
FIG. 12 is a block diagram of an identification signal generator in the ATSC DTV standard in accordance with an embodiment of the present invention.

FIG. 12 is a block diagram of an identification signal generator in the ATSC DTV standard.

Referring to FIG. 12, the identification signal generators 404, 506 and 607 in the ATSC DTV standard each include a Kasami sequence generation unit 901 and a sequence modulation unit 902.

The Kasami sequence generation unit 901 generates a Kasami sequence having a length of 65535, and the sequence modulation unit 902 performs binary phase shift keying (BPSK) modulation on the Kasami sequence generated by the Kasami sequence generation unit 901 and transmits the modulated sequence to the partial correlators 405, 507 and 608.

Figure 13:
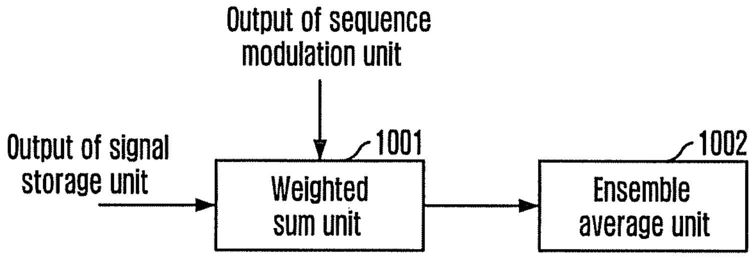
FIG. 13 is a block diagram of a partial correlator in the ATSC DTV standard in accordance with an embodiment of the present invention.
Figure 14:
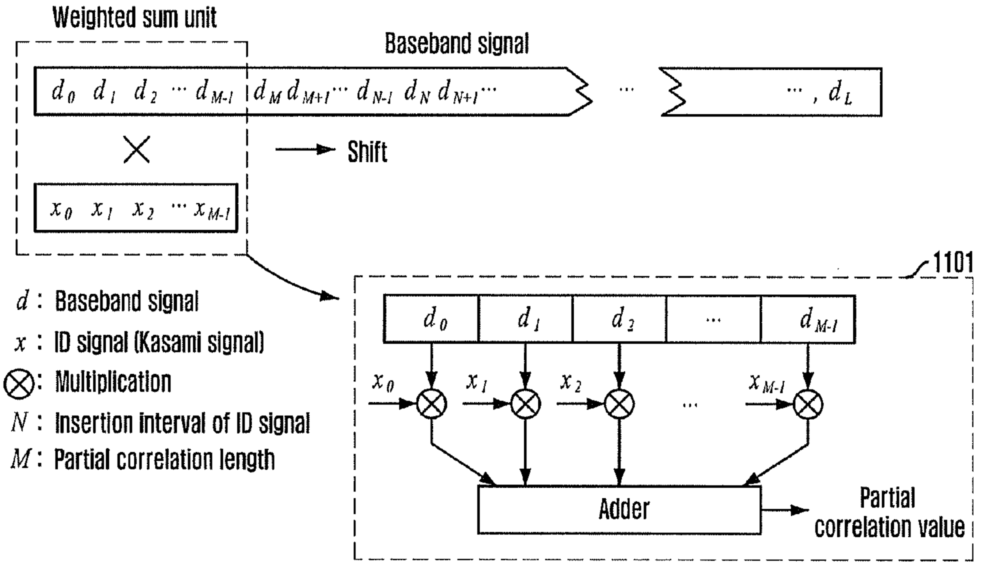
FIG. 14 is a block diagram of a weighted sum unit of the partial correlator in the ATSC DTV standard in accordance with an embodiment of the present invention.

FIG. 13 is a block diagram of a partial correlator in the ATSC DTV standard, and FIG. 14 illustrates a detailed configuration of a weighted sum unit of the partial correlator in the ATSC DTV standard.

Referring to FIG. 13, the partial correlators 405, 507 and 608 in the ATSC DTV standard each include a weighted sum unit 1001 and an ensemble average unit 1002.

The weighted sum unit 1001 calculates a partial correlation value between, e.g., a reception signal stored in the signal storage unit 803 of the baseband signal storage 606 and an identification signal generated by the sequence modulation unit 902 of the identification signal generator 607. The ensemble average unit 1002 calculates an accumulated average of partial correlation values calculated by the weighted sum unit 1001, and transmits the accumulated average to the correlation value compensator 609.

The reception signal input to the weighted sum unit 1001 may be a signal down-converted by the down-converter 403 in accordance with the embodiment of FIG. 4, or a signal stored in the signal storage 505 in accordance with the embodiment of FIG. 6. Since other operations are identical, only one embodiment will be described.

Operations of the weighted sum unit 1001 and the ensemble average unit 1002 in accordance with another embodiment of the present invention will now be described in more detail with reference to FIG. 14 and the following Equations 1 and 2.

First, an identification signal ($x_0, x_1, \ldots, x_{M-1}$) of a desired length M (M≤N where N denotes a length of an identification signal inserted by a transmitter or repeater, i.e., a partial correlation length) is taken from an identification signal ($x_0, x_1, \ldots, x_{N-}$) generated by the identification signal generator 607. Then, a correlation value ($v_i$, $0 \le i \le N$) between the identification signal ($x_0, x_1, \ldots, x_{M-1}$) of the partial correlation length and a baseband signal ($d_0, d_1, \ldots, d_{M-1}, d_M, d_{M+1}, \ldots, d_{N-1}, d_N, d_{N+1}, \ldots, d_L$, where L denotes a length of a stored signal) stored in the baseband signal storage 606 is calculated through a weighted sum unit 1101. This is expressed as the following Equation 1.

$$v_i = \frac{1}{M}\sum_{j=0}^{M-1} d_{i+j}x_j, \quad 0 \le i \le L-M \qquad \text{Eq. 1}$$

An accumulative average of correlation values calculated K times based on the above Equation 1 is calculated by the ensemble average unit 1002, based on the following Equation 2.

$$c_l = \frac{1}{K}\sum_{k=0}^{K-1} v_{kN+l}, \quad 0 \le l < N \qquad \text{Eq. 2}$$

Figure 15:
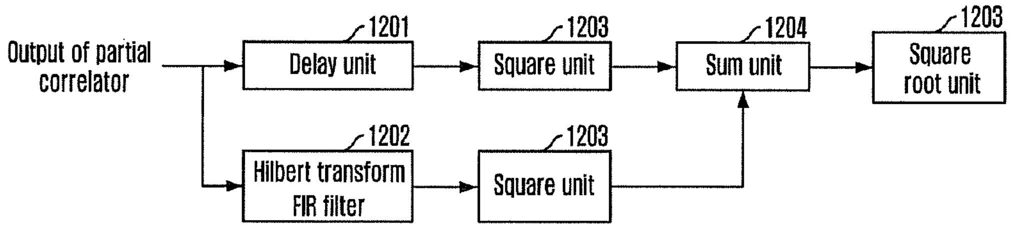
FIG. 15 is a block diagram of a power compensator in the ATSC DTV standard in accordance with an embodiment of the present invention.

FIG. 15 is a block diagram illustrating a power compensator in the ATSC DTV standard in accordance with an embodiment of the present invention.

Referring to FIG. 15, the power compensators 406, 508 and 609 in the ATSC DTV standard each include a delay unit 1201, a Hilbert transform Finite Impulse Response (FIR) filter 1202, a square unit 1203, a sum unit 1204 and a square root unit 1205.

The Hibert transform FIR filter 1202 receives an output of the partial correlators 405, 507 and 608 and outputs a 90° inverted signal of the output. Operations of the Hilbert transform FIR filter 1202 will now be described. A 90° inverted signal of the average value calculated based on the above Equation 2 is obtained by the Hibert transform FIR filter 1202 based on the following Equation 3.

$$\hat{c}_l = \frac{1}{\pi}\int_{-\infty}^{\infty} \frac{c_m}{l-m}\,dm, \quad 0 \le l < N \qquad \text{Eq. 3}$$

The delay unit 1201 delays an output of the partial correlator 608 by a process time in the Hilbert FIR filter 1202, i.e., the time corresponding to a tap number of a FIR filter of the Hilbert transform FIR filter 1202. The square unit 1203 calculates squares of signals respectively output from the delay unit 1201 and the Hilbert transform FIR filter 1202, and the sum unit 1202 sums the squared signals obtained by the square unit 1203. The square root unit 1205 calculates a square root of the summed squared signals obtained by the sum unit 1202, and sends the output of the square root unit 1203, to the channel profile extractor.

An output signal of the square root unit 1205 is obtained based on the following Equation 4.

$$z_l = \sqrt{c_{l-L}^2 + \hat{c}_l^2}, \quad 0 \le l < N \qquad \text{Eq. 4}$$

where L denotes a time delayed by the delay unit 1201.

The identification signal analyzing apparatus and method using a power compensator in accordance with the embodiments of the present invention is suitable in the field of, e.g., broadcasting and communication. However, the present invention is not limited thereto, and is applicable to any environment requiring a general identification signal.

The identification signal analyzing methods for compensating power of a channel profile in accordance with the embodiments of the present invention can be realized as a program and stored in a computer-readable recording medium, such as CD-ROM, RAM, ROM, floppy disk, hard disk and magneto-optical disk. Since the process can be easily implemented by those skilled in the art of the present invention, further description will not be provided herein.

The present application contains subject matter related to Korean Patent Application No. 2007-0090534, filed in the Korean Intellectual Property Office on Sep. 6, 2007, the entire contents of which is incorporated herein by reference.

While the present invention has been described with respect to the specific embodiments, it will be apparent to those skilled in the art that various changes and modifications may be made without departing from the spirit and scope of the invention as defined in the following claims.

Industrial Applicability

The present invention is applicable to broadcasting and communication systems or the like.

What is claimed is:

1. An identification signal analyzing apparatus comprising:

an identification signal generator for generating an identification signal identical to a known identification signal inserted by a transmission device;

a partial correlator for calculating a correlation value between a received signal including the known identification signal inserted by the transmission device and the identification signal generated by the identification signal generator through a partial correlation;

a power compensator for compensating power of the correlation value calculated by the partial correlator; and a channel profile extractor for extracting a channel profile from the correlation value compensated by the power compensator;

wherein the power compensator extracts a 90° inverted value of the correlation value calculated by the partial correlator, and compesates power of the correlation value by using the extracted 90° inverted value.

2. The identification signal analyzing apparatus of claim 1, wherein the power compensator comprises:

a Hilbert transform Finite Impulse Response (FIR) filter for inverting the correlation value calculated by the partial correlator by 90° to output a 90° inverted value;

a delay unit for delaying the correlation value calculated by the partial correlator by a process time of the Hilbert transform FIR filter and outputting the delayed value;

a square unit for squaring the value output from the Hilbert transform FIR filter and the delayed value output from the delay unit;

a sum unit for summing the squared values obtained by the square unit and outputting a sum value of the squared values; and a square root unit for calculating a square root of the sum value output from the sum unit and outputting the square root.

3. The identification signal analyzing apparatus of claim 2, wherein the process time of the Hilbert transform FIR filter is a time corresponding to a tap number of an FIR filter of the Hilbert transform FIR filter.

4. The identification signal analyzing apparatus of claim 1, wherein the partial correlator comprises:

a weighted sum unit for calculating a partial correlation value between the received signal including the known identification signal and the identification signal generated by the identification signal generator; and an ensemble average unit for calculating an accumulated average of the partial correlation value calculated by the weighted sum unit.

5. The identification signal analyzing apparatus of claim 1, wherein the identification signal generator comprises:

a Kasami sequence generation unit for generating a Kasami sequence of a preset length; and a sequence modulation unit for performing binary phase shift keying modulation on the Kasami sequence generated by the Kasami sequence generation unit.

6. An identification signal analyzing method comprising:

generating an identification signal identical to a known identification signal;

calculating a correlation value between a received signal including the known identification signal and the generated identification signal through a partial correlation;

compensating the calculated correlation value; and extracting a channel profile from the compensated correlation value; and wherein said compensating power of the calculated correlation value comprises:

extracting a 90° inverted value of the calculated correlation value; and compensating power of the calculated correlation value by using the extracted 90° inverted value.

7. The identification signal analyzing method of claim 6, wherein said compensating power of the calculated correlation value further comprises:

performing Hilbert transform Finite Impulse Response (FIR) filtering to invert by 90° the calculated correlation value;

delaying the calculated correlation value by a process time it takes for said performing of the Hilbert transform FIR filtering;

squaring the 90° inverted value and the delayed value;

summing the squared values obtained by said squaring; and calculating a square root of the summed squared values.

8. The identification signal analyzing method of claim 7, wherein the process time is a time corresponding to a tap number of an FIR filter used in said performing of the Hilbert transform FIR filtering.

* * * * *